(12) United States Patent
Menut et al.

(10) Patent No.: US 7,115,933 B2
(45) Date of Patent: Oct. 3, 2006

(54) INTEGRATED CIRCUIT AND FABRICATION PROCESS

(75) Inventors: Olivier Menut, Grenoble (FR); Yvon Gris, Tullins (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/466,145

(22) PCT Filed: Jan. 9, 2002

(86) PCT No.: PCT/FR02/00054

§ 371 (c)(1),
(2), (4) Date: Dec. 26, 2003

(87) PCT Pub. No.: WO02/056370

PCT Pub. Date: Jul. 18, 2002

(65) Prior Publication Data

US 2004/0113193 A1 Jun. 17, 2004

(30) Foreign Application Priority Data

Jan. 12, 2001 (FR) .................................. 01 00419

(51) Int. Cl.
*H01L 27/108* (2006.01)
*H01L 27/10* (2006.01)
*H01L 29/68* (2006.01)

(52) U.S. Cl. ............... 257/301; 257/302; 257/E21.396; 29/571

(58) Field of Classification Search ................ 257/297, 257/301, 304, 370, 302; 438/242, 246
See application file for complete search history.

(56) References Cited

U.S. PATENT DOCUMENTS

| | | | | | |
|---|---|---|---|---|---|
| 4,649,625 | A | * | 3/1987 | Lu | ............................. 438/245 |
| 4,792,834 | A | * | 12/1988 | Uchida | ....................... 257/304 |
| 5,981,332 | A | * | 11/1999 | Mandelman et al. | ....... 438/246 |
| 5,998,821 | A | * | 12/1999 | Hieda et al. | ................ 257/301 |
| 6,600,199 | B1 | * | 7/2003 | Voldman et al. | ............. 257/370 |

* cited by examiner

*Primary Examiner*—Andy Huynh
*Assistant Examiner*—Dao H. Nguyen
(74) *Attorney, Agent, or Firm*—Lisa K. Jorgenson; Stephen Bongini; Fleit, Kain, Gibbons, Gutman, Bongini & Bianco P.L.

(57) ABSTRACT

An integrated circuit has at least one semiconductor device for storing charge that includes at least one elementary active component and at least one elementary storage capacitor. The device includes a substrate having a lower region containing at least one buried capacitive elementary trench forming the elementary storage capacitor, and an elementary well located above the lower region of the substrate and isolated laterally by a lateral electrical isolation region. The elementary active component is located in the elementary well or in and on the elementary well. The capacitive elementary trench is located under the elementary active component and is in electrical contact with the elementary well. In one preferred embodiment, the lateral electrical isolation region is formed by a trench filled with a dielectric material and has a greater depth than that of the elementary well. Also provided is a method for fabricating an integrated circuit that includes a semiconductor device for storing charge.

24 Claims, 4 Drawing Sheets

INTEGRATED CIRCUIT AND FABRICATION PROCESS

This application is a 371 of PCT/FR02/00054 filed Jan. 9, 2002.

FIELD OF THE INVENTION

The invention relates to integrated circuits and more particularly to analog devices for storing charge, in particular analog memory cells or light sensors.

BACKGROUND OF THE INVENTION

Electronic memories usually operate with two logic levels 1 and 0. For dynamic random access memory (DRAM memory), these levels correspond to the charged or uncharged state of a capacitor. Reading the memory cell destroys the state of this memory cell since the charges stored in the capacitor are used as a read signal. In addition, for the sake of the memory cell density, the capacitance of the capacitor is low, and it is then impossible to differentiate several charge levels of the capacitor. Moreover, because of the various leakage currents associated with the control devices, the charge on the capacitor decreases and is not stable with time.

A memory cell of the DRAM type must be as small as possible for the sake of density. It consists of an access transistor controlling the charging or the discharging of a capacitor. This capacitor must, on the one hand, have a maximum capacitance and, on the other hand, occupy a minimum surface. Currently, the capacitor is made either in the silicon substrate or in the upper interconnect layers of the integrated circuit.

In the first case, the capacitor is located at the side of the access transistor. In the second case, the capacitor occupies a large volume above the transistor, a volume which cannot be used to make interconnections in the integrated circuit.

In both cases, the density of the memory cell, that is to say its overall size, is affected thereby.

SUMMARY OF THE INVENTION

The aim of the invention is to provide a solution to this problem.

One aim of the invention is to propose a device having a minimum surface and capable of storing charge, to provide a very long retention time for the stored charge, to allow the stored charge to be read without loss of information and to evaluate the amount of stored charge in an analog manner.

One of the aims of the invention is thus to propose the use of such a device as an analog memory cell providing non-destructive reading of the stored information.

Another aim of the invention is to propose the use of such a device, once matrix-configured, as an image sensor allowing a light image to be transformed into analog electrical information. More precisely, the image is transferred into a matrix, of which each element represents, in the form of analog electrical information, one element (pixel) of the original image. The writing operations of this matrix do not destroy the imprint of the previously written image, which allows elementary operations such as the superposition of two images to be carried out at the sensor.

The invention therefore proposes an integrated circuit, comprising a semiconductor device for storing charge having at least one elementary storage capacitor and one elementary active component enabling the stored charge to be measured. According to a general characteristic of the invention, the device comprises a substrate having a lower region containing at least one buried capacitive elementary trench forming said elementary storage capacitor and an elementary well located above said lower region of the substrate and isolated laterally by a lateral electric isolation region. The elementary active component is made in the elementary well or in and on the elementary well and said capacitive elementary trench is located under the elementary active component and is in electrical contact with the elementary well.

In other words, the device according to the invention comprises an elementary active component with a capacitor of the buried trench type located not at the side of the elementary component but under the elementary component. The overall size is therefore reduced. The first electrode of the capacitor is the substrate and the second electrode is a conductor filling the trench. This capacitor is located below the elementary well of the elementary active component, and is connected to this elementary well by direct contact between the internal electrode of the capacitor and the elementary well. The surface area of the elementary well-substrate junction is reduced by the presence of the buried capacitor.

This elementary active component may in particular be a MOSFET transistor, a JFET transistor, or else a resistor.

The lateral isolation zone is advantageously formed by a trench filled with a dielectric and has a greater depth than that of the elementary well.

The region extending between the elementary capacitive trench and the lateral isolation zone forms an elementary PN junction between the elementary well and said lower substrate region. And the area of said elementary junction is advantageously lower than the contact surface of said elementary capacitive trench with the elementary well.

According to one embodiment, the elementary trench comprises an upper region in contact with the elementary well and having the same type of conductivity as that of the elementary well.

According to one embodiment, the substrate is made of silicon, and the capacitive trench comprises an inner region of doped silicon, partially enveloped by an isolating wall laterally separating said inner region of the substrate, and surmounted by the upper region made of doped silicon.

The device can be used as an analog memory cell.

In this case, according to one embodiment, the storage device comprises several adjacent elementary active components associated with several buried capacitive elementary trenches, respectively, in respective electrical contact with several elementary wells, said lower region of the substrate forming an isolating well with respect to the rest of the substrate, so as to form an analog memory plane which can be erased by applying a chosen voltage to the isolating well.

The device can also be used as a light sensor.

In the latter case, according to one embodiment, the storage device comprises several adjacent elementary active components associated with several buried capacitive elementary trenches, respectively, in respective electrical contact with several elementary wells, so as to form a light sensor, each pixel of which is formed by an elementary active component and by the associated elementary trench.

The processes for fabricating semiconductor components may destroy the crystal continuity of the surface of a portion of the initial single-crystal semiconductor substrate. This is particularly the case when making a trench. At the location of the trench, the semiconductor substrate has a different material without a crystal structure. Consequently, the surface of that portion of the substrate occupied by the trench cannot be used to produce semiconductor devices.

The invention also makes it possible to provide a solution to this problem.

One aim of the invention is to allow the production of a single-crystal substrate enabling the subsequent formation of an epitaxial layer of silicon free of crystal defects and in which the control transistor or transistors of the device will be made.

The invention therefore also proposes a process for fabricating an integrated circuit comprising a semiconductor device for storing charge having an elementary active component, for example a control transistor, and an elementary storage capacitor. According to a general characteristic of the invention, a) an initial single-crystal substrate locally having a capacitive elementary trench emerging at the surface of the initial substrate and forming a discontinuity in the crystal lattice is prepared, b) the initial substrate is recessed at the elementary trench, c) the crystal lattice is amorphized around the periphery of the recess, d) a layer of amorphous material having the same chemical composition as that of the initial substrate is deposited on the structure obtained in the previous step, e) the structure obtained in the previous step is thermally annealed in order to recrystallize the amorphous material so as to be continuous with the single-crystal lattice of the initial substrate, f) an upper substrate layer is grown by epitaxy, g) an elementary well located above and in contact with the capacitive elementary trench is defined in said upper substrate layer and the elementary active component is made in and on said elementary well.

According to one implementation mode, the process comprises, prior or subsequent to step e), a surface planarization step, for example a chemical-mechanical polishing operation.

The definition of the elementary well comprises, for example, the production of isolation regions, implantation and annealing.

According to one implementation mode, the amorphization step comprises localized ion implantation around the recess by means of a masking operation.

According to one implementation mode, in step a), a first layer of a first material and a second layer of a second material are deposited in succession on the initial substrate, then an elementary trench is etched, which is filled with a fill material, and, in step b), the first layer and an upper portion of the elementary trench fill material are selectively etched with respect to said second layer so as to form lateral cavities and said recess at the crystal discontinuity, and said second layer is removed.

In step a), the filling of the elementary trench advantageously comprises the following steps:

the walls of the elementary trench are lined with oxide by thermal oxidation;

highly doped polycrystalline silicon is deposited in the elementary trench so as to fill it;

the polycrystalline silicon deposited previously is etched so that the fill level of the elementary trench is below the surface of the initial substrate.

BRIEF DESCRIPTION OF THE DRAWINGS

Other advantages and characteristics of the invention will appear on examining the detailed description of embodiments and of implementation modes, which are in no way limiting, and the appended drawings in which.

DETAILED DESCRIPTION OF PREFERRED EMBODIMENTS

Figure 1A:
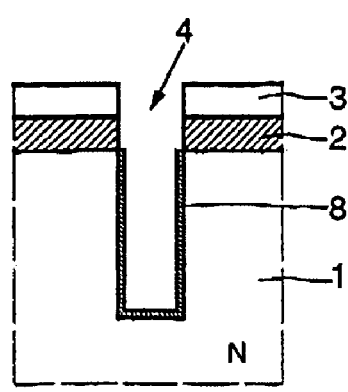
FIGS. 1*a* to 1*i* illustrate schematically the main steps of a process according to the invention together with embodiments of a storage device according to the invention.

The starting substrate of the process of the invention, or the initial substrate, is illustrated in FIG. 1*a* and in this case comprises an elementary trench. In this case, the initial substrate 1 is n-doped. The elementary trench may be made, according to one implementation of the process of the invention, by firstly depositing a layer of silicon oxide 2 on the initial single-crystal silicon substrate 1. The thickness of this layer 2 may vary between 0.01 micron and 1 micron, and is preferably about 2000 Å.

Next, a layer of silicon nitride 3 is deposited on the oxide 2. The thickness of this layer 3 may also vary between 0.01 micron and 1 micron, and is also preferably about 2000 Å.

Next, first of all the nitride 3 and the oxide 2, then finally the single-crystal silicon of the substrate 1 are etched in a conventional manner using a photolithography operation, in order to form the elementary trench 4.

The elementary trench 4 has a depth of about 6 µm and a width, preferably less than 1 µm, for example equal to 0.3 µm.

Next, a controlled thermal oxidation is carried out so as to deposit a layer of silicon oxide 8 of a thickness between 40 and 1000 Å, preferably between 50 and 300 Å, on the walls of the elementary trench 4. The device illustrated in FIG. 1*a* is obtained.

Next, heavily $p^+$-doped polycrystalline silicon 9 is deposited on the wafer so as to fill the elementary trench 4. The doping of the silicon is carried out in situ.

Figure 1B:
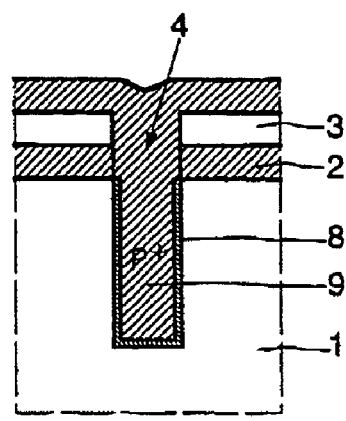

A device as illustrated in FIG. 1*b* is obtained.

Next, the polycrystalline silicon 9 deposited beforehand is etched, at least so as to remove it from the surface of the wafer. Moreover, this etching is carried out until the level of the polycrystalline silicon in the elementary trench 4 is below the surface of the initial substrate 1.

Figure 1C:
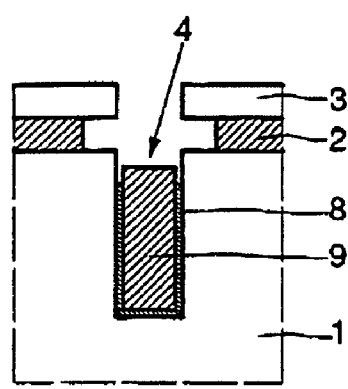

The next step consists of a controlled deoxidation, essentially so as to form, under the silicon nitride layer 3, two lateral cavities of given width in the oxide layer 2, as illustrated in FIG. 1*c*. Some of the silicon oxide 8 in the trench 4 is also removed.

This deoxidation is carried out by isotropic etching using hydrofluoric acid or else by isotropic plasma etching using fluorine. The device illustrated in FIG. 1*c*, in which the trench is lined with a silicon oxide layer 8 whose height is less than the height of the doped polycrystalline silicon layer 9 in the elementary trench 4, is then obtained. Two lateral cavities of given width appear below the silicon nitride layer 3 and in the silicon oxide layer 2.

Next, the silicon nitride mask 3 is conventionally removed.

The exposed silicon is then amorphized.

Figure 1D:
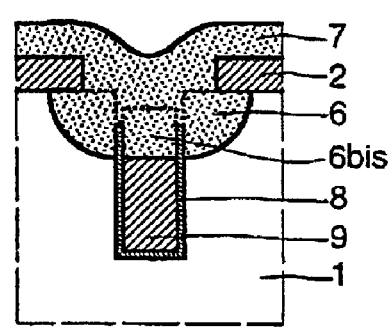

The silicon exposed at this stage of the process is the single-crystal silicon of the substrate 1 together with the emergent portion of doped polycrystalline silicon 9 in the elementary trench 4. Thus, amorphous silicon regions labeled 6 and 6a are created (FIG. 1d).

The localized simultaneous amorphization of the regions 6 and 6a is self-aligned on the elementary trench. The amorphization is carried out conventionally by destroying the crystal lattice of the silicon and of the polycrystalline silicon 6a, for example by the implantation of heavy particles such as ions. Within the context of the invention, it will be especially preferred to implant fluoride ions.

Next, an amorphous silicon layer 7 is deposited over the entire surface of the wafer so as at least to fill the lateral cavities and the recess above the elementary trench 4. The amorphous layer 7 deposited therefore has, in this case, a role of connecting the regions 6 and 6a and resealing the surface. The amorphous silicon is deposited conventionally at low temperature. For example, it is possible to use an LPCVD (low-pressure chemical vapor deposition) furnace, injecting silane at a sufficiently low temperature, for example less than 600° C., typically less than 400° C. The device illustrated in FIG. 1d is thus obtained, in which, in an elementary trench 4 etched in a substrate 1, a polycrystalline silicon block 9 is partially enveloped in a silicon oxide layer 8. The height of this block, less than that of the elementary trench 4, is also less than the height of the silicon oxide envelope 8. This element is surmounted by an amorphous silicon region comprising the amorphized silicon regions 6 and 6a and the amorphous silicon 7 deposited.

Figure 1E:
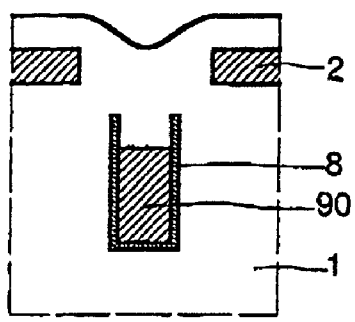

A thermal annealing operation is carried out so as to restore the crystal structure of the amorphous silicon. The thermal annealing allows the amorphous silicon to recrystallize, by the epitaxial regrowth of the amorphous silicon 6, 7 starting from the single-crystal silicon of the initial substrate 1. The restructuring of the single-crystal silicon lattice results in FIG. 1e in which the previous amorphous silicon layer now merges with the single-crystal silicon of the substrate 1.

It should be noted here that, according to the invention, the zone 6 is spatially limited, and the boundary between this zone 6 and the substrate 1 is easily localized by ion implantation. Moreover, this boundary is a "soft" boundary, that is to say that the change of the single crystal Si state to the amorphous Si state is very gradual. These characteristics lead to a good recrystallization yield of the zone 6, and to recrystallization without defects, that can be difficult to obtain with a large surface to be recrystallized.

Furthermore, the amorphization of the zone 6b is makes it possible to prevent a "backtrack" of crystalline defects in the single crystal layer from the polycrystalline silicon.

Next, a chemical-mechanical polishing operation is carried out, stopping on the silicon oxide layer 2 in order to remove the recrystallized silicon layer on the surface of the wafer. The silicon oxide layer 2 is then conventionally removed. Next, in order to planarize the surface, the wafer is subjected to a final chemical-mechanical polishing operation.

Figure 1F:
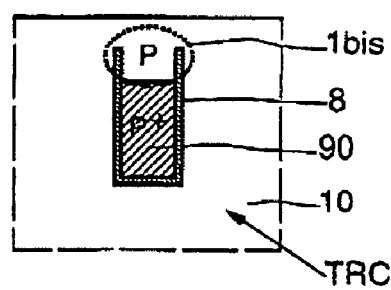

After the steps of making the surface of the substrate uniform, a final single-crystal silicon substrate 10 is obtained, illustrated in FIG. 1f, the perfectly planar and uniform single-crystal surface of which allows the defect-free epitaxial growth of single-crystal silicon. The thickness of the substrate 10 above the elementary trench is about 0.2 microns. Moreover, the substrate comprises a buried capacitive elementary trench TRC consisting of highly doped polycrystalline silicon 90 partially enveloped by a silicon oxide wall 8 separating it laterally from the substrate 1. Above this buried capacitive elementary trench and in the substrate 1, there is a doped region 1a, of the same conductivity as the polycrystalline silicon 90. This region corresponds to the amorphized polycrystalline silicon region 6a and to the portion of silicon 7 doped by diffusion of dopants during annealing.

The localized destruction, according to the invention, of the crystal lattice before its restoration is particularly advantageous for capacitive trenches since it allows the polycrystalline silicon 90 (the entire capacitor) to be buried by controlled etching of the sidewall oxide 8, without the need for providing an additional oxide.

Figure 1G:
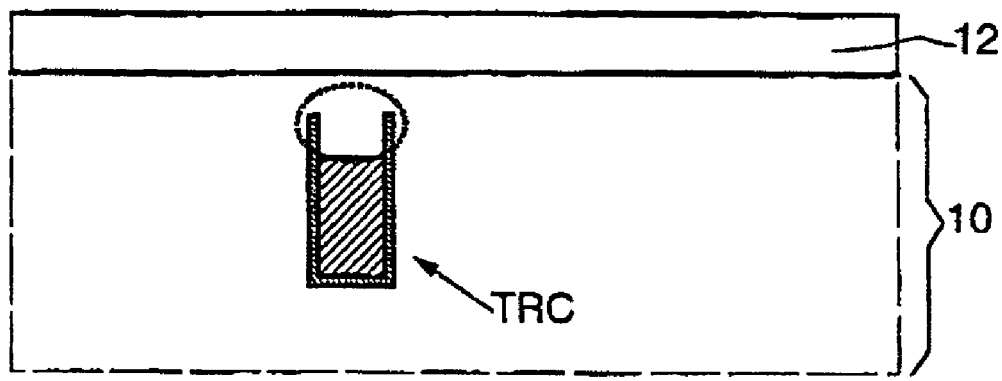

The process continues with the epitaxial growth on the surface of the substrate 10, of an upper substrate layer 12, made of p-doped silicon (FIG. 1g), and having a thickness of about 1 μm. It is in this layer 12 that the control transistor T of the device DIS will be made. The substrate SB, made from the substrate 10 and from the layer 12, incorporates the capacitive elementary trench TRC.

Figure 1H:
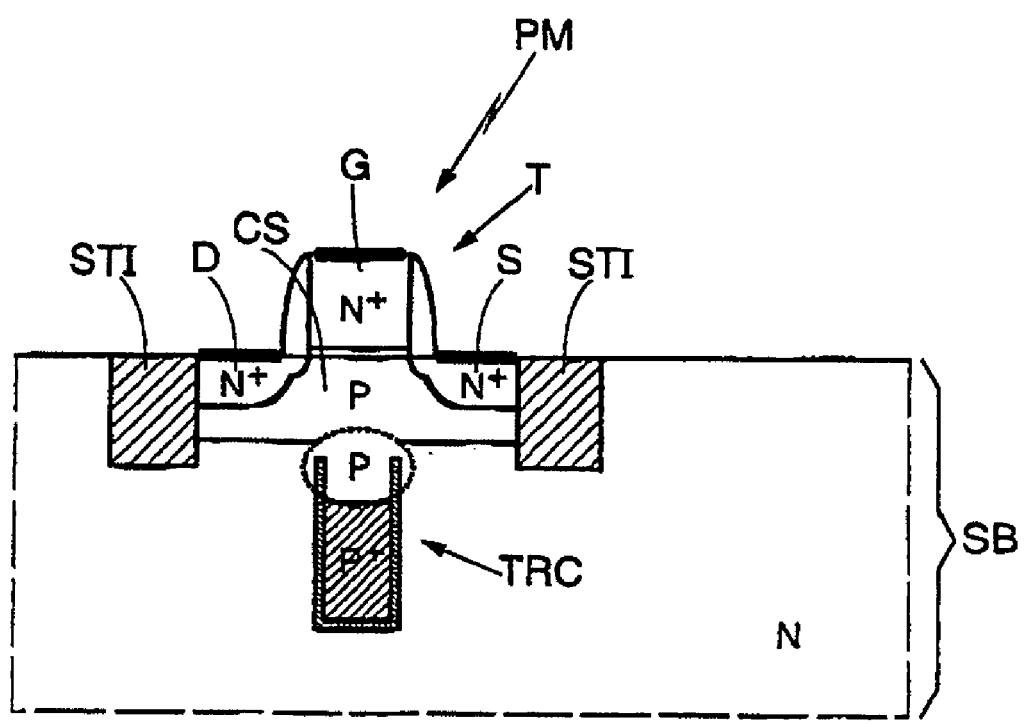

More specifically, as illustrated in FIG. 1h, shallow isolating side regions STI having a depth of about 1.5 μm are made around the buried elementary trench TRC. In the volume of silicon delimited by these regions STI, a p-doped elementary well CS is made by ion implantation followed by diffusion and annealing. The implantation is, for example, an implantation of boron at $10^{13}$ at/cm$^2$ at an energy of 80 keV. The annealing is carried out, for example, at 950° C. for 20 minutes. The depth of this elementary well CS is such that electrical continuity is provided between the elementary well and the upper region 1a of the p-doped elementary trench. The depth of the regions STI is sufficient to isolate two adjacent elementary wells.

Inside the volume delimited by the regions STI, the control transistor T, in this case of the NMOS type, is formed in a quite conventional manner. More specifically, after having made the side isolation regions STI, the gate oxide, then the gate polysilicon which is etched to form the isolated gate G of the transistor, are formed.

The drain and source regions are made conventionally by double implantation before and after forming isolating spaces ES flanking the gate. A conventional siliciding step makes it possible to metallize the drain, source and gate regions so as to provide electrical contacts.

Finally, an NMOS transistor, whose elementary well CS is isolated from the substrate by a p-n elementary junction and by the dielectric layer 8 of the elementary trench TRC is therefore obtained.

The capacitive elementary trench under the well makes it possible to
- produce an MOS transistor close to the minimum dimensions, the well CS of this transistor being directly connected to an electrode of the capacitive elementary trench without using the metal interconnect,
- increase the capacitance between the elementary well and the substrate,
- decrease the surface area of the "p well/n substrate" elementary junction, therefore to decrease the currents in this elementary junction and in particular the leakage currents.

The device may thus be advantageously used as an analog memory cell or even as an elementary light sensor.

When the device DIS is used as an analog memory cell, it operates with three cycles, that is a write cycle, a cycle for retaining the stored information and a read cycle.

During writing, the elementary well CS is biased at a given negative voltage. More specifically, the substrate is biased, for example, at 0 V, the drain −1 V, and the source and the gate are left floating. Electrons are then injected into the floating well CS and they bias it to said negative voltage, for example −1 V.

During the retention, the charge thus stored is considerable since the capacitance of the well with respect to the substrate is high. This charge only disappears very slowly since the leakage currents, in particular those with respect to the substrate, are low.

The characteristics of the control transistor depend directly on the potential of the well. In particular, for an n-type MOS transistor, the threshold voltage of the transistor increases when the potential of the well decreases. Thus, for a gate bias greater than the threshold voltage corresponding to a zero well potential, the drain current is a function of the well voltage for a given drain voltage.

Knowledge of this drain current makes it possible to measure the well voltage, and consequently to measure the amount of charge stored. This measurement is an analog measurement and does not destroy the charge stored in the floating well.

Figure 1I:
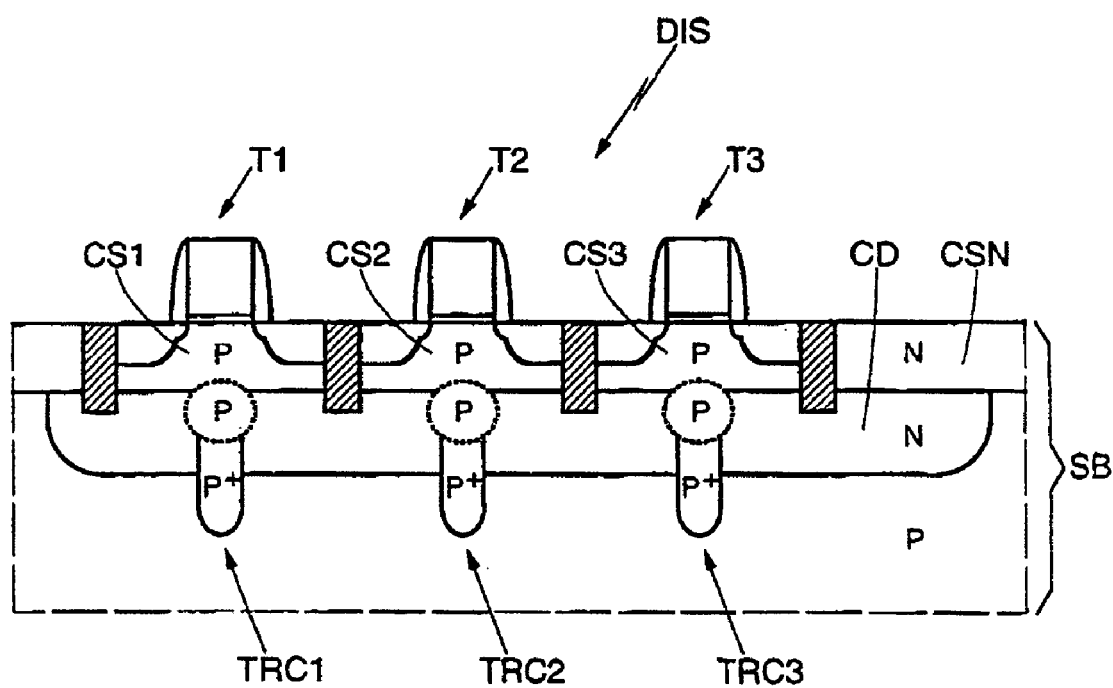

In FIG. 1*i*, several (for example three) adjacent pairs of transistors T1–T3 and of associated buried capacitive trenches TRC1–TRC3, are shown schematically. Each pair forms a pixel of a light sensor.

With respect to the implementation mode detailed above, the initial substrate is p-doped. Consequently, a double-well structure comprising an n-doped diffused isolation well CD is provided. The elementary wells CS1–CS3 of the transistors are then formed as indicated above and are mutually separated by isolation regions STI. An additional n-type well CSN is also made by implantation making it possible to bias the diffused well CD.

The matrix-configured sensor with several pixels (in practice several million pixels) operates with three cycles, that is a precharge cycle, a cycle for acquiring the light information, and a read cycle.

During precharging, the potential of the well of each pixel can be set, as explained above, by the bias of the drain (for example −1 V). Another advantageous possibility for this type of sensor consists in biasing the source, the gate and the drain of the transistor to 0 V, and in biasing the well CSN (therefore the wells CS1–CS3) successively at −1 V then at 0 V.

With this solution, all the elementary wells CSi are found to have a potential close to −1 V when the voltage of the well CSN (or CD) goes to 0 V. The potentials of the wells do not vary with time for the same reasons as those explained above.

When acquiring the light information, the source, gate and drain of each transistor are left floating and the well CSN is biased at 0 V. When a light image is formed on the surface of the sensor, each pixel is illuminated differently. In particular, the light flux increases the leakage current of each well CSi/well CD junction. As a result, there is an increase in the potential of each elementary well CSi which depends on the illumination.

The previously formed image is read by measuring the voltage of the elementary wells CSi through the current of each control transistor. This measurement is an analog measurement and is not destructive. The measurement of the light intensity is consequently an analog measurement.

It is also possible, if the precharge cycle is not carried out, to compare two successive images in order to measure, for example, their differences. The methods of compressing a digitized image are thus facilitated.

The structure illustrated in FIG. 1*i* may also be used as an analog memory plane that can be erased by applying a chosen voltage to the isolation well CD.

Although the embodiments and implementational modes which have just been described use an MOS transistor as elementary active component, it would be possible to provide any active component allowing measurement of the stored charge, especially a resistor or a junction field effect transistor (JFET).

Figure 2:
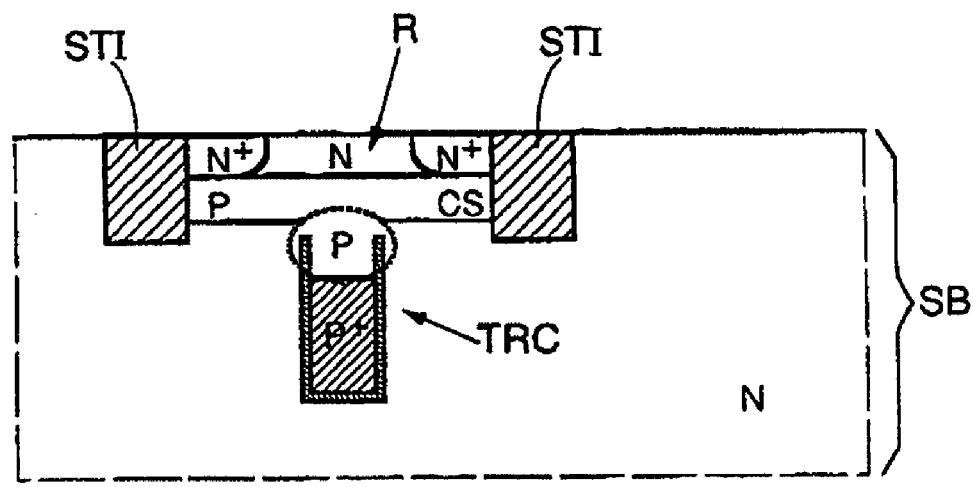
FIGS. 2 and 3 illustrate schematically two other embodiments of a storage device according to the invention.

In this regard, FIG. 2 illustrates schematically a charge storage device whose elementary active component is a resistor.

This resistor R is, for example, a layer of n-doped silicon, whose value of resistance depends on the number of (electron) carriers in this resistor. Thus, by way of indication, if the dopant concentration is less than $5 \times 10^{18}$ at/cm$^3$, the potential difference between the resistor and the elementary well CS will create a depletion in the resistance due to carriers. The value of this resistance is consequently correlated with that of the potential of the elementary well.

In this variant, the value of the resistance that can be easily measured conventionally is generally an image of the potential of the elementary well and therefore of the amount of charge stored.

This device is consequently very simple to produce and economical.

Figure 3:
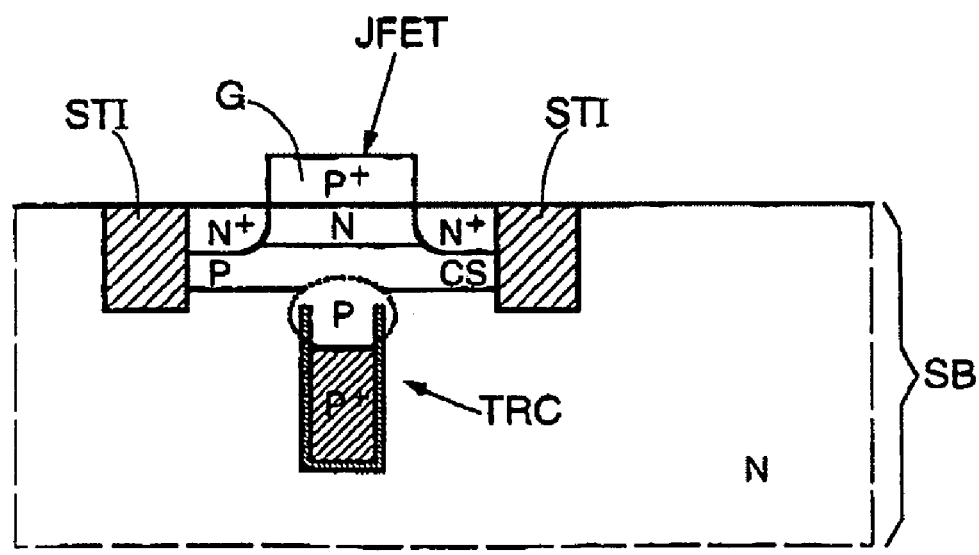

FIG. 3 illustrates schematically a charge storage device whose elementary active component is a JFET transistor. In this case, the n-doped resistive layer under the gate of the transistor is clamped by the potential of the gate and by the potential of the elementary well CS.

The measurement of the current flowing in the JFET transistor provides an image of the amount of charge stored.

This device offers the advantage of being higher performing, in particular in terms of sensitivity, than the one illustrated in FIG. 2.

What is claimed is:

1. An integrated circuit that includes at least one semiconductor device for storing charge, said device including at least one elementary active component enabling a stored charge to be measured and at least one elementary storage capacitor, said device comprising:
    a substrate that includes a lower region containing at least one buried capacitive elementary trench forming the elementary storage capacitor, and an elementary well located above the lower region of the substrate and isolated laterally by at least one lateral electrical isolation region,
    wherein the elementary active component is located in the elementary well or in and on the elementary well, and
    the capacitive elementary trench is located directly under the elementary active component and is in direct electrical contact with the elementary well through direct contact between an internal electrode of the elementary storage capacitor and the elementary well.

2. The integrated circuit according to claim 1, wherein the lateral electrical isolation region is formed by a trench filled with a dielectric material and has a greater depth than that of the elementary well so that the entire depth of the elementary well is isolated laterally.

3. The integrated circuit according to claim 1,
    wherein a region extending between the elementary capacitive trench and the lateral electrical isolation zone forms an elementary pn junction between the elementary well and the lower region of the substrate, and the elementary junction is lower than a contact surface of the elementary capacitive trench with the elementary well.

4. The integrated circuit according to claim 1, wherein the elementary trench includes an upper region that is in contact with the elementary well and has the same conductivity type as the elementary well.

5. The integrated circuit according to claim 4,
wherein the substrate is made of silicon, and
the capacitive elementary trench includes an inner region of doped silicon, an isolating wall at least partially enveloping the inner region so as to laterally separate the inner region and the substrate, and an upper region of doped silicon that surmounts the inner region.

6. The integrated circuit according to claim 5,
wherein the substrate has n-type conductivity, and
the elementary well and the inner region and the upper region of the capacitive elementary trench have p-type conductivity.

7. The integrated circuit according to claim 1, wherein the elementary active component is a resistor.

8. The integrated circuit according to claim 1, wherein the elementary active component is a MOS transistor.

9. The integrated circuit according to claim 1, wherein the elementary active component is a JFET transistor.

10. The integrated circuit according to claim 1,
wherein the device includes a plurality of adjacent elementary active components and a plurality of buried capacitive elementary trenches in respective electrical contact with a plurality of elementary wells, and
the lower region of the substrate forms an isolating well with respect to the rest of the substrate, so as to form an analog memory plane that can be deleted by applying a sufficient voltage to the isolating well.

11. The integrated circuit according to claim 1,
wherein the device includes a plurality of adjacent elementary active components and a plurality of buried capacitive elementary trenches in respective electrical contact with a plurality of elementary wells, arranged so as to form a light sensor, and
each pixel of the light sensor is formed by one of the elementary active components and an associated one of the buried capacitive elementary trenches.

12. The integrated circuit according to claim 1, wherein the device is an analog memory cell.

13. The integrated circuit according to claim 1, wherein the elementary storage capacitor is located directly under the elementary active component such that all of the elementary storage capacitor is located below the elementary active component.

14. The integrated circuit according to claim 1, wherein the elementary storage capacitor is located under the elementary well such that all of the elementary storage capacitor is located below the elementary well.

15. An information processing system including at least one integrated circuit, the integrated circuit including at least one semiconductor device for storing charge, the device including at least one elementary active component enabling a stored charge to be measured and at least one elementary storage capacitor, said device comprising:
a substrate that includes a lower region containing at least one buried capacitive elementary trench forming the elementary storage capacitor, and an elementary well located above the lower region of the substrate and isolated laterally by at least one lateral electrical isolation region,
wherein the elementary active component is located in the elementary well or in and on the elementary well, and
the capacitive elementary trench is located directly under the elementary active component and is in direct electrical contact with the elementary well through direct contact between an internal electrode of the elementary storage capacitor and the elementary well.

16. The information processing system according to claim 15,
wherein a region extending between the elementary capacitive trench and the lateral electrical isolation zone forms an elementary pn junction between the elementary well and the lower region of the substrate, and
the elementary junction is lower than a contact surface of the elementary capacitive trench with the elementary well.

17. The information processing system according to claim 15, wherein the elementary trench includes an upper region that is in contact with the elementary well and has the same conductivity type as the elementary well.

18. The information processing system according to claim 15,
wherein the device includes a plurality of adjacent elementary active components and a plurality of buried capacitive elementary trenches in respective electrical contact with a plurality of elementary wells, and
the lower region of the substrate forms an isolating well with respect to the rest of the substrate, so as to form an analog memory plane that can be deleted by applying a sufficient voltage to the isolating well.

19. The information processing system according to claim 15,
wherein the device includes a plurality of adjacent elementary active components and a plurality of buried capacitive elementary trenches in respective electrical contact with a plurality of elementary wells, arranged so as to form a light sensor, and
each pixel of the light sensor is formed by one of the elementary active components and an associated one of the buried capacitive elementary trenches.

20. A semiconductor device for storing charge, said device comprising:
a storage capacitor formed by at least one buried capacitive trench located in a lower region of a substrate;
an active component enabling a stored charge to be measured, the active component being located in or in and on a well, the well being located above the lower region of the substrate,
wherein the capacitive trench is located directly under the active component and is in electrical contact with the well through direct contact between an internal electrode of the elementary storage capacitor and the well.

21. The device according to claim 20,
wherein a region extending between the capacitive trench and a lateral electrical isolation zone forms a pn junction between the well and the lower region of the substrate, and
the junction is lower than a contact surface of the capacitive trench with the well.

22. The device according to claim 20, wherein the trench includes an upper region that is in contact with the well and has the same conductivity type as the well.

23. The device according to claim 20,
wherein the device includes a plurality of adjacent active components and a plurality of buried capacitive trenches in respective electrical contact with a plurality of wells, and the lower region of the substrate forms an isolating well with respect to the rest of the substrate, so as to form an analog memory plane that can be deleted by applying a sufficient voltage to the isolating well.

24. The device according to claim 20,
wherein the device includes a plurality of adjacent active components and a plurality of buried capacitive trenches in respective electrical contact with a plurality of wells, arranged so as to form a light sensor, and each pixel of the light sensor is formed by one of the active components and an associated one of the buried capacitive trenches.

* * * * *